United States Patent [19]

Uda

[11] Patent Number: 5,686,918
[45] Date of Patent: Nov. 11, 1997

[54] ANALOG-TO-DIGITAL CONVERTER WITH DIGITAL-TO-ANALOG CONVERTER AND COMPARATOR

[75] Inventor: Nobuya Uda, Itami-shi, Japan

[73] Assignees: Mitsubishi Electric Semiconductor Software Co., Ltd., Hyogo; Mitsubishi Denki Kabushiki Kaisha, Tokyo, both of Japan

[21] Appl. No.: 570,712

[22] Filed: Dec. 11, 1995

[30] Foreign Application Priority Data

Jul. 24, 1995 [JP] Japan .................................. 7-187257

[51] Int. Cl.$^6$ .................................................. H03M 1/46
[52] U.S. Cl. ............................ 341/161; 341/158; 341/165
[58] Field of Search ........................... 341/114, 126, 341/165, 142, 158, 159, 161

[56] References Cited

FOREIGN PATENT DOCUMENTS 4407238  6/1995  Germany .

OTHER PUBLICATIONS

"LSI Handbook" edited by IECE, Nov. 30, 1984, first edition, Ohm Corp. pp. 622–623 and 635–636.

Primary Examiner—Jeffrey A. Gaffin
Assistant Examiner—Jason H. Vick
Attorney, Agent, or Firm—Leydig, Voit & Mayer, Ltd.

[57] ABSTRACT

An analog-to-digital converter includes a comparator for comparing a voltage output by a digital-to-analog converter with an input analog voltage at each bit of an n-bit word. The input analog voltage and the analog output voltage of the digital-to-analog converter are alternatingly used as the reference in the comparison, i.e., for every other bit of the n bits. A one-bit result-of-comparison signal indicative of the result of the comparison is output for each of the n bits. Only alternating result-of-comparison signals are inverted and the inverted and non-inverted result-of-comparison signals are stored in a successive approximation register as the converted digital signal and are supplied to the digital-to-analog converter for use in the comparison.

9 Claims, 10 Drawing Sheets

ANALOG-TO-DIGITAL CONVERTER WITH DIGITAL-TO-ANALOG CONVERTER AND COMPARATOR

BACKGROUND OF THE INVENTION

1. Field of the Invention

The present invention relates to a successive approximation type analog-to-digital converter (hereinafter called "A-D converter") capable of improving conversion speed without speeding up a control clock used as the reference.

2. Description of the Related Art

A successive approximation type A-D converter has often been mounted in a one-chip microcomputer or the like due to its simple circuit structure. In this case, a system clock used to control the microcomputer is normally used as a control clock supplied to the A-D converter.

Figure 9:
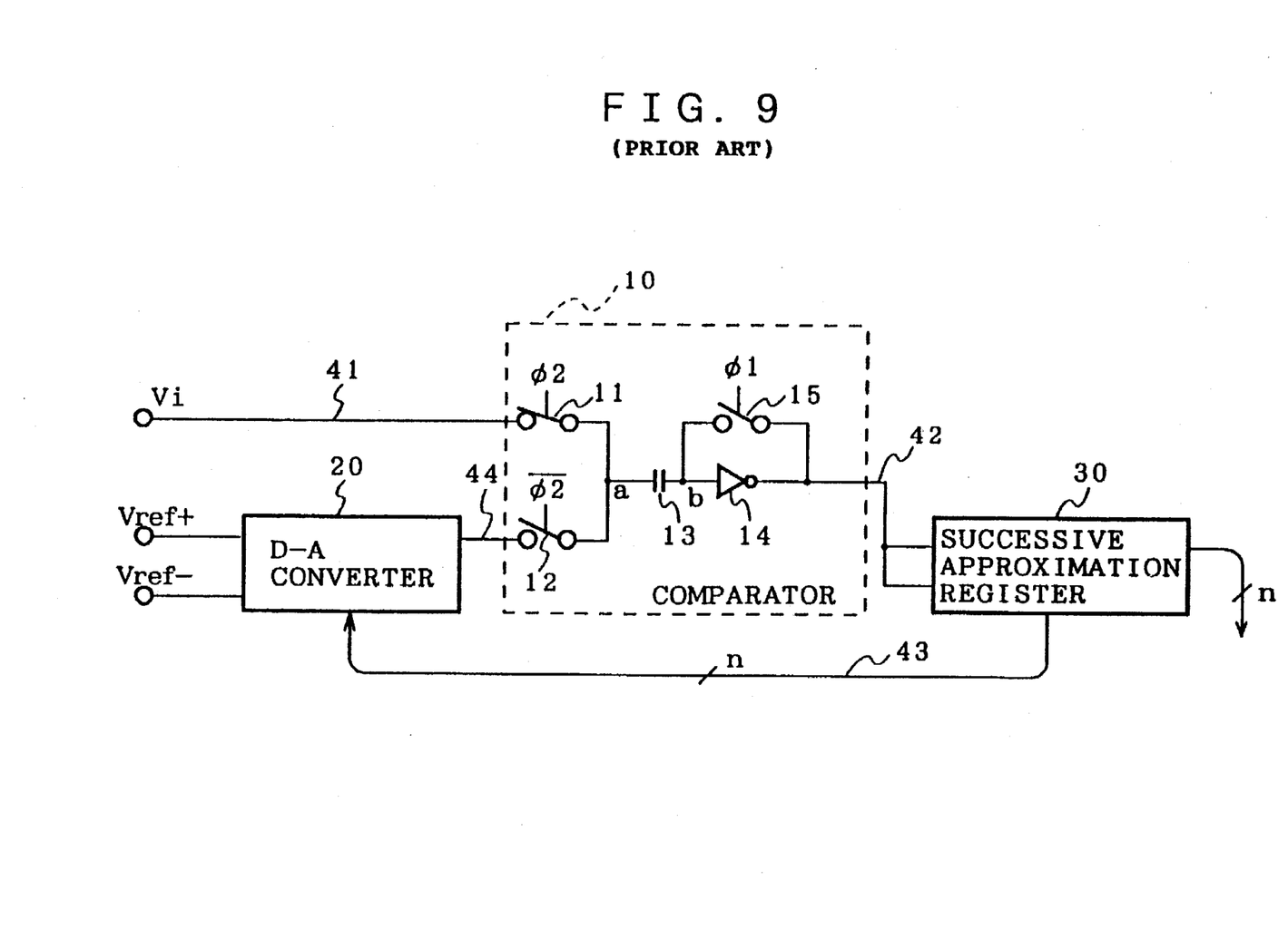
FIG. 9 is a circuit diagram showing the structure of a conventional A-D converter.

FIG. 9 is a circuit diagram showing the structure of such a conventional A-D converter. In FIG. 9, reference numerals 10, 20, 30, 41, 42, 43 and 44 respectively indicate a comparator, a D-A converter, a successive approximation register, an analog input line, an output line for the comparator 10, a digital signal line for supplying a digital output of the successive approximation register 30 to the D-A converter 20, and a signal line for supplying an analog signal produced from the D-A converter 20. Further, reference numerals 11, 12, 13, 14 and 15 respectively indicate a switch for turning on and off a signal supplied through the analog input line 41, a switch for turning on and off the analog signal output from the D-A converter 20, a capacitor, an inverting amplifier, and a switch for short-circuiting and opening the input and output of the inverting amplifier 14. Namely, the comparator 10 comprises the switches 11, 12 and 15, the capacitor 13 and the inverting amplifier 14.

Figure 10:
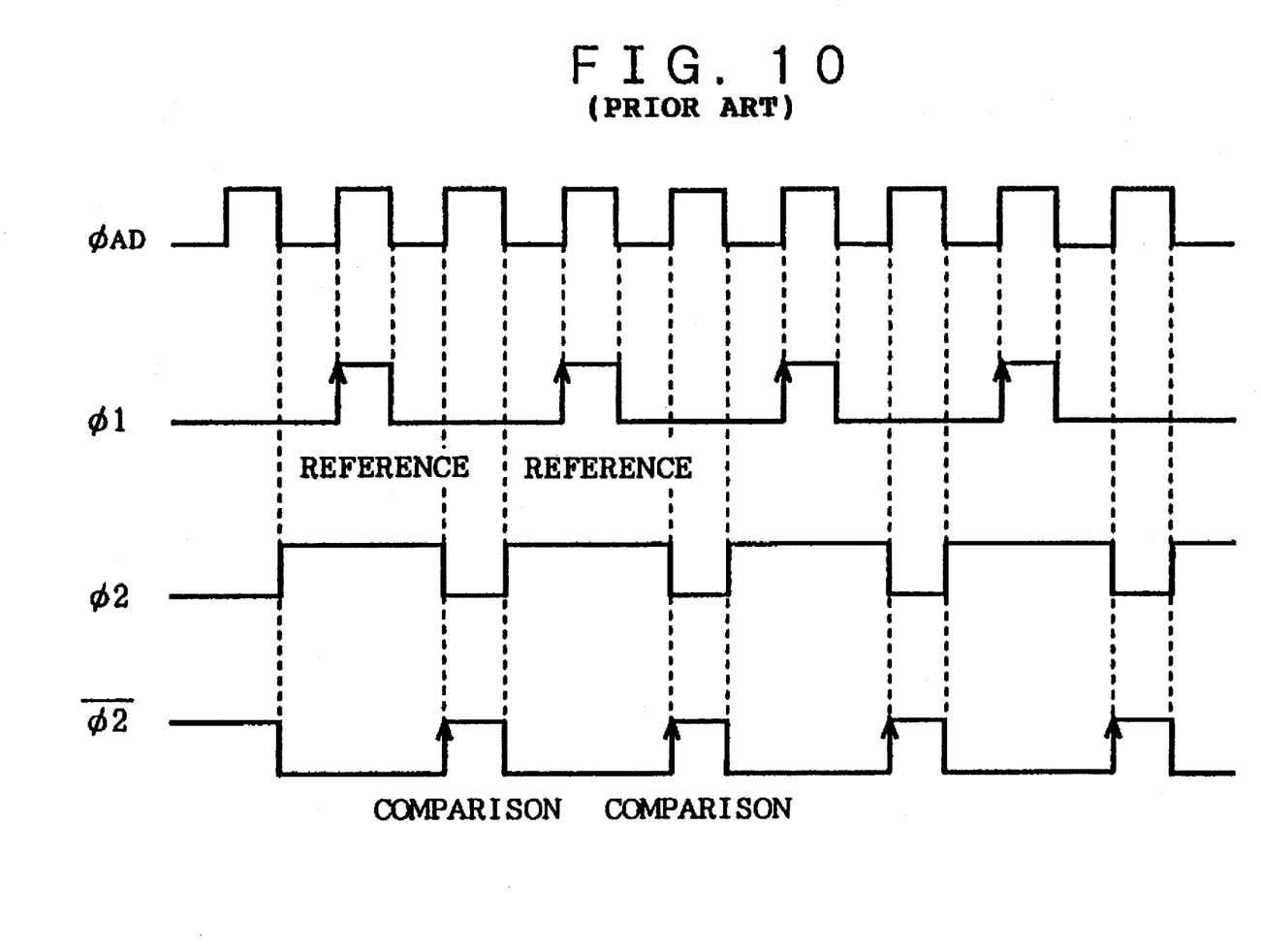
FIG. 10 is a timing chart for describing timing for respective signals employed in the A-D converter shown in FIG. 9.

FIG. 10 is a timing chart for describing timings for respective signals employed in the conventional A-D converter shown in FIG. 9. In the same drawing, reference symbol $\phi_{AD}$ indicates a reference clock applied to the A-D converter. Reference symbol $\phi1$ indicates a signal for driving the switch 15. Reference symbols $\phi2$ and $\overline{\phi2}$ respectively indicate signals having opposite phases, for controlling the switches 11 and 12. Incidentally, the signals $\phi1$, $\phi2$ and $\overline{\phi2}$ are generated from the reference clock $\phi_{AD}$. Further, the D-A converter 20 can generate voltages having $2^n$ levels in units of $\frac{1}{2^n}$ of the difference between reference voltages Vref+ and Vref−. In the drawings employed in the present application, inverted signals such as $\overline{\phi2}$ are represented by placing bars over the symbols.

The operation of the A-D converter will now be described. The switch 11 is first closed in response to the signal $\overline{\phi2}$ so that a measuring analog input signal is input to the comparator 10. The comparator 10 then closes the switch 15 in response to the signal $\phi1$ so as to short-circuit the input and output of the inverting amplifier 14. At this time, the balance between an electric charge of the capacitor 13 at the point a side and an electric charge thereof at the point b side is achieved. Further, the voltage at the point b side becomes equal to a threshold value of the inverting amplifier 14 itself by a self-output of the inverting amplifier 14.

After the voltage at the point b side has been made equal to the threshold value of the inverting amplifier 14, the switch 15 is opened in response to the falling edge of the signal $\phi1$ so that the input voltage of the inverting amplifier 14 is maintained at a voltage equal to the threshold value of the inverting amplifier 14 due to the electric charge at the point b.

Next, the switch 11 is closed in response to the falling edge of the signal $\phi2$ and the switch 12 is closed in response to the rising edge of the signal $\phi2$, so that an analog signal produced through the output line 44 of the D-A converter 20 is input to the comparator 10. An electric charge proportional to the analog input voltage input through the analog input line 41 is stored at the point a. However, the voltage and charge at the point a are varied according to the voltage corresponding to the difference between the analog input voltage and the output voltage of the D-A converter 20 by closing the switch 12. In response to this variation, the charge and voltage at the point b are also changed, thus resulting in a variation in input voltage of the inverting amplifier 14.

According to the above operation, when the output voltage of the D-A converter 20 is lower than the analog input voltage, "1" is outputted from the output terminal of the comparator 10. When the output voltage of the D-A converter 20 is higher than the analog input voltage, "0" is output from the output terminal of the comparator 10. The output signals are stored so as to correspond to one bit of the successive approximation register 30 and data stored in the successive approximation register 30 is transferred to the D-A converter 20.

In the A-D converter having a plurality of bits, the above operation corresponding to one bit is repeated by the number of the bits of the A-D converter.

A detailed description of the operation of the conventional successive approximation type A-D converter is given on page 635 in the "LSI Handbook" (Nov. 30, 1984, first edition, Ohm Corp.) edited by IECE, for example. Further, the operation of the comparator has been described as a "chopper-type comparator" on page 622 in the same book.

In this type of conventional A-D converter, the frequency of the system clock has been increased to improve conversion speed of the A-D converter. However, if the entire A-D converter is activated at high speed by raising the frequency of the system clock, then a problem arises in that power consumption is increased.

In the conventional successive approximation type A-D converter described above, the repeat operation of setting the threshold value of the comparator 10 based on the analog input voltage as mentioned above, comparing it with the output of the D-A converter 20 and setting the threshold value of the comparator 10 again based on the analog input signal is executed based on the control signals. The switch 11 is turned on only when the threshold value of the chopper-type comparator is set. The switch 12 is turned on only when a comparison operation is performed. It is therefore necessary to maintain the relationship of phase between the signals $\phi1$ and $\phi2$ as shown in FIG. 10. Namely, even if the reference clock is speeded up and the conversion speed is improved, it is necessary to set a time required for the comparator 10 that starts operating on the falling edge of the signal $\phi2$ to determine the result of comparison so as to fall within a period in which the signal $\phi2$ is low in level. Therefore, the simple speed up of the reference clock imposes a limitation on the speed up of the A-D converter.

The conventional A-D converter is constructed as described above and has a problem that if the reference clock is speeded up to make the conversion speed of the A-D converter faster, then the entire system incurs an increase in power consumption. A further problem arises in that a limitation is imposed on the speed up of the reference clock to speed up the conversion rate of the A-D converter.

SUMMARY OF THE INVENTION

The present invention has been made to solve the above problems. It is therefore an object of the present invention to provide an A-D converter capable of increasing conversion speed without speeding up a reference clock.

According to one aspect of the present invention, for achieving the above object, there is provided an analog-to-digital converter comprising a digital-to-analog converter for converting an input n-bit digital signal into a second analog voltage and outputting the converted second analog voltage therefrom, comparing means for comparing the second analog voltage output from the digital-to-analog converter and a first analog voltage at each bit of n bits with the first analog voltage and the second analog voltage alternately used as a reference for comparison and outputting a signal indicative of a one-bit result-of-comparison signal therefrom, signal inverting means for alternately and repeatedly inverting and non-inverting result-of-comparison signals output from the comparing means in turn every bit of the n bits and outputting signals obtained as a result of the inversion and the non-inversion therefrom, and a successive approximation register having storage areas corresponding to the n bits, for successively storing the signals output from the signal inverting means in the storage areas every bit of the n bits, outputting the n-bit digital signal stored in each of the storage areas to the outside as a digital signal obtained as a result of conversion, and transferring the n-bit digital signal to the digital-analog converter. According to this construction, the analog-to-digital conversion can be executed at high speed without speeding up a reference clock.

The analog-to-digital converter according to the present invention further includes control means for controlling the comparing means so as to cause the chopper-type comparator to refer to the first analog voltage upon comparison of odd bits in the n bits to thereby compare the first analog voltage and the second analog voltage and for controlling the comparing means so as to cause the chopper-type comparator to refer to the second analog voltage upon comparison of even bits in the n bits to thereby compare the first analog voltage and the second analog voltage. According to this construction, the analog-to-digital conversion can be executed at high speed without speeding up the reference clock.

The analog-to-digital converter according to the present invention still further comprises control means for controlling the comparing means so as to cause the chopper-type comparator to refer to the first analog voltage upon comparison of even bits in the n bits to thereby compare the first analog voltage and the second analog voltage and for controlling the comparing means so as to cause the chopper-type comparator to refer to the second analog voltage upon comparison of odd bits in the n bits to thereby compare the first analog voltage and the second analog voltage. According to this construction, the analog-to-digital conversion can be executed at high speed without speeding up the reference clock.

Still further, in the analog-to-digital converter according to the present invention, the control means is constructed so as to control a switch so that a signal sent from the comparator is inverted by an inverting amplifier upon comparison of the odd bits in the n bits and control the switch so that the signal supplied from the comparator is not inverted by the inverting amplifier upon comparison of the even bits in the n bits. The analog-to-digital conversion can be executed at high speed without speeding up the reference clock.

Still further, in the analog-to-digital converter according to the present invention, the control means is constructed so as to control a switch so that a signal supplied from the comparator is inverted by an inverting amplifier upon comparison of the even bits in the n bits and control the switch so that the signal supplied from the comparator is not inverted by the inverting amplifier upon comparison of the odd bits in the n bits. According to this construction, the analog-to-digital conversion can be executed at high speed without speeding up the reference clock.

Still further, the analog-to-digital converter according to the present invention has inverting amplifiers which are respectively provided on the input side of the successive approximation register at even-bit storage areas and respectively invert even-bit signals output from the comparing means upon storage. According to this construction, analog-to-digital conversion can be executed at high speed without switching the inverting amplifiers.

Still further, the analog-to-digital converter according to the present invention includes inverting amplifiers which are respectively provided on the input side of the successive approximation register at odd-bit storage areas and respectively invert odd-bit signals output from the comparing means upon storage. According to this construction, the analog-to-digital conversion can be executed at high speed without switching the inverting amplifiers.

The above and other objects, features and advantages of the present invention will become apparent from the following description and the appended claims, taken in conjunction with the accompanying drawings in which preferred embodiments of the present invention are shown by way of illustrative example.

BRIEF DESCRIPTION OF THE DRAWINGS

The invention will now be described with reference to the accompanying drawings, wherein.

DETAILED DESCRIPTION OF THE PREFERRED EMBODIMENTS

[First embodiment]

A first embodiment of the present invention will hereinafter be described with reference to the accompanying drawings.

Figure 1:
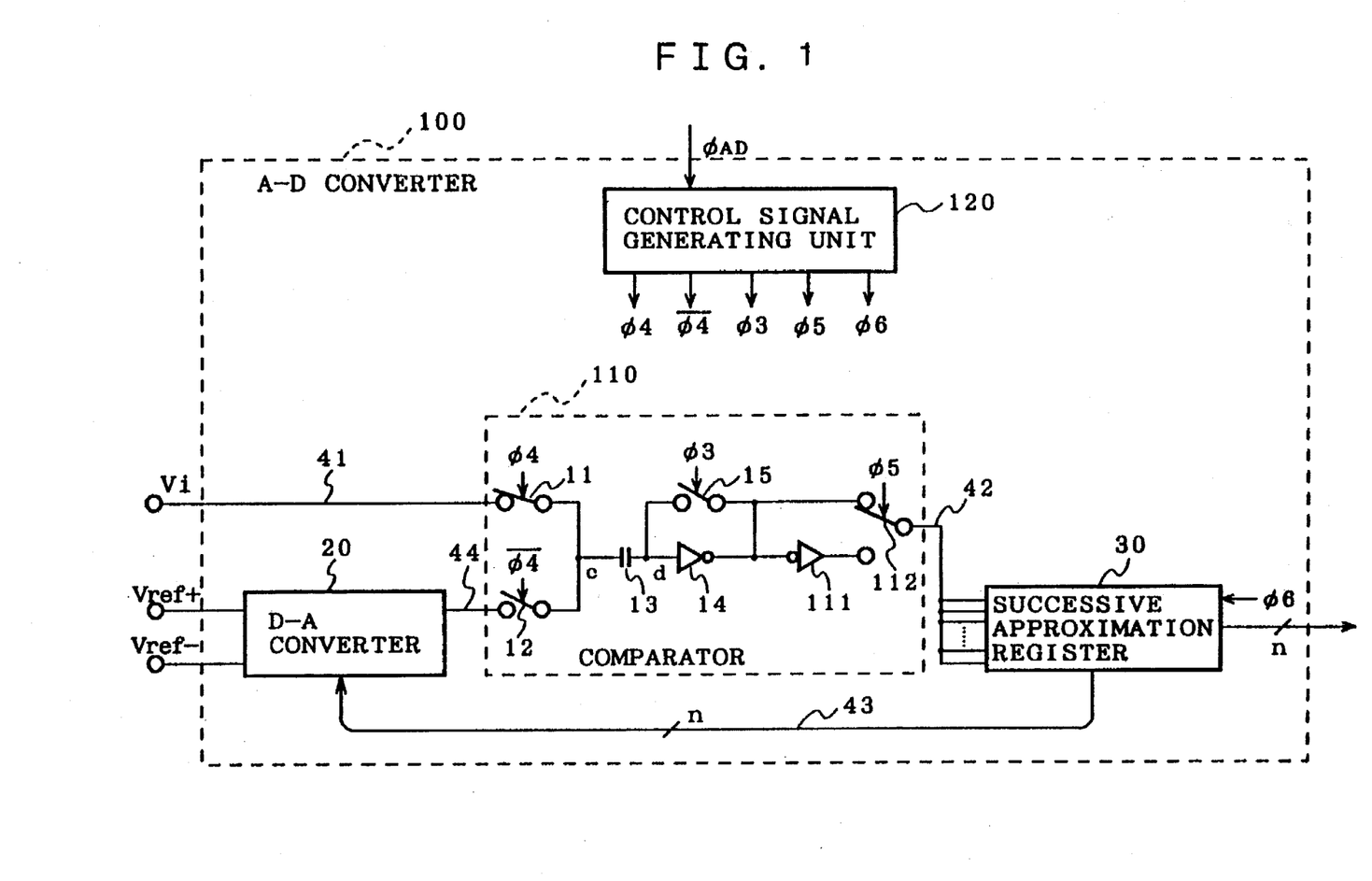
FIG. 1 is a view showing the structure of an A-D converter according to a first embodiment of the present invention.

FIG. 1 illustrates the configuration of an A-D converter according to the first embodiment of the present invention. In the drawing, reference numeral 100 indicates the A-D converter according to the present embodiment. Reference numeral 110 indicates a comparator for setting a threshold value to a measuring analog input voltage in the case of odd bits and setting the threshold value to a voltage output from a D-A converter 20 in the case of even bits. Reference numeral 120 indicates a control signal generating unit for generating control signals supplied to individual parts of the A-D converter 100. Reference numeral 111 indicates an inverting amplifier. Reference numeral 112 indicates a switch for selecting either one of the action of outputting an output signal of the comparator 110 through the inverting amplifier 111 and the action of outputting it without being through the inverting amplifier 111. When an input control signal is at a low level, the switch 112 is activated so as to output an output signal produced from an inverting amplifier 14 through the inverting amplifier 111. On the other hand, when the input control signal is at a high in level, the switch 112 is activated so as to output the output signal of the inverting amplifier 14 without being through the inverting amplifier 111. Incidentally, the same elements of structure as those employed in the conventional A-D converter shown in FIG. 9 are identified by like reference numerals and the description of certain common elements will therefore be omitted.

Figure 2:
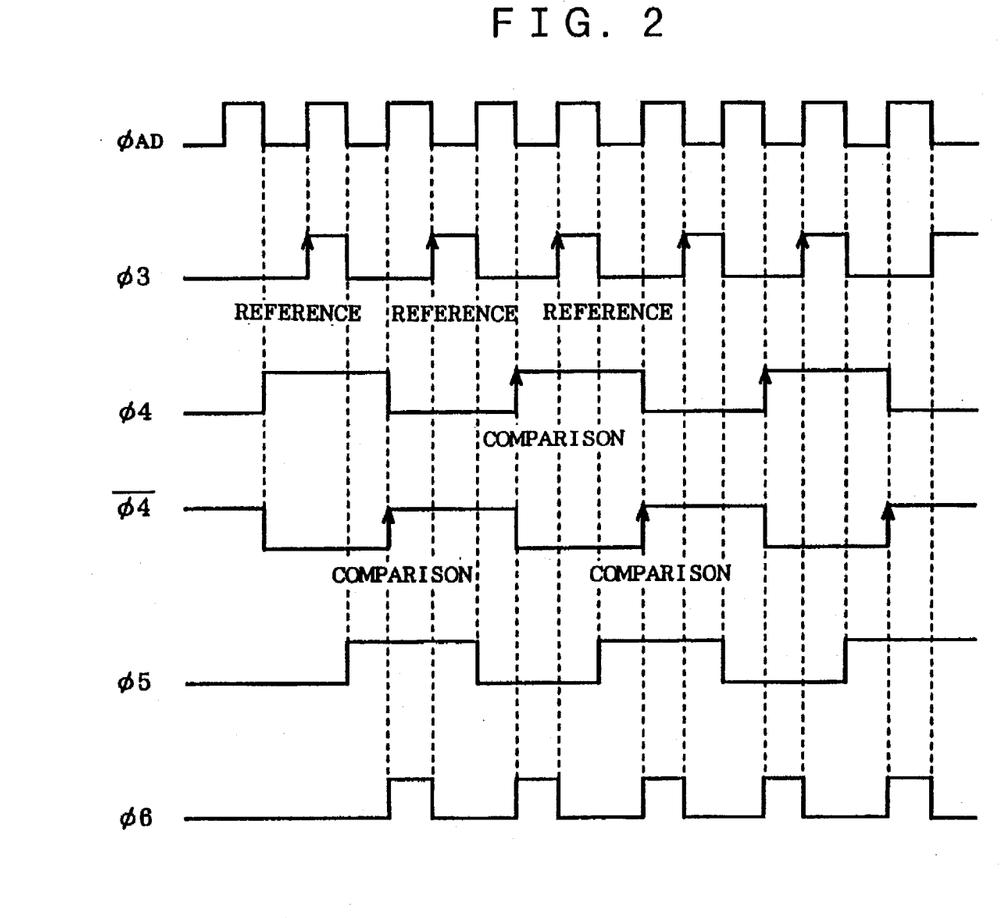
FIG. 2 is a timing chart for describing timings for respective control signals employed in the A-D converter shown in FIG. 1.

The operation of the present invention in accordance with the first embodiment will now be described. FIG. 2 is a timing chart for describing timings for respective control signals employed in the A-D converter 100 shown in FIG. 1. In the same drawing, reference symbol $\phi_{AD}$ indicates a reference clock similar to a conventional one, which is applied to the A-D converter. Reference symbol ø3 indicates a signal for driving the switch 15. Reference symbols ø4 and $\overline{ø4}$ respectively indicate signals having opposite phases, for controlling switches 11 and 12. Reference symbol ø5 indicates a signal for activating the switch 112. Reference symbol ø6 indicates a signal indicative of timing provided to store data in a successive approximation register. The signals ø3, ø4, $\overline{ø4}$, ø5, and ø6 are respectively generated from the reference clock $\phi_{AD}$ in the control signal generating unit 120.

When the A-D converter 100 starts A-D conversion, the A-D converter 100 temporarily sets a first bit, i.e., the MSB (Most Significant Bit), of the successive approximation register 30 to "1" and other bits to "0", respectively. A digital signal output from the successive approximation register 30 is supplied to the D-A converter 20 through an output signal line 43. Therefore, the output of the D-A converter 20 is brought to half (½) of a full-scale voltage $V_{FS}$. Next, the switch 11 is closed in response to the rising edge of the signal ø4 so that an analog input line 41 is brought into an ON state. The switch 15 is then closed in response to the rising edge of the signal ø3 short-circuiting the input and output of the inverting amplifier 14. Thereafter, the switch 12 is closed in response to the rising edge of the signal $\overline{ø4}$ so that the voltage input to the inverting amplifier 14 is varied based on a voltage corresponding to the difference between the analog input voltage Vi (first analog voltage) and the voltage (second analog voltage) output from the D-A converter 20. This variation is similar to that produced when the conventional A-D converter is activated. Further, the comparator 110 outputs a signal of "1" when the output voltage of the D-A converter 20 is lower than the first analog input voltage. On the other hand, when the output voltage of the D-A converter 20 is higher than the analog input voltage, the comparator 110 outputs a signal of "0". Each of the output signals is stored in the successive approximation register 30 as the MSB during an interval in which the signal ø6 is high in level. Thus the comparison between the $V_{FS}/2$ and the analog input voltage is completed. Thereafter, each bit stored in the successive approximation register 30 is transferred to the D-A converter 20 where it is D-A converted.

Upon comparison between the analog input voltage and a second bit, i.e., the next bit after the MSB, the A-D converter 100 then sets a second bit as seen from the MSB of the successive approximation register 30 to "1". When the result of comparison of MSB is "1" at this time, the voltage output from the D-A converter 20 becomes $(V_{FS}/2)+(V_{FS}/4)$. On the other hand, when the result of comparison of MSB is "0", the output voltage thereof becomes $(V_{FS}/2)-(V_{FS}/4)$.

In the case of the comparison between the second bit and the analog input voltage, unlike the comparison of the MSB, the threshold value of the comparator 110 is set based on the output voltage of the D-A converter 20 on the rising edge of the signal ø3.

Next, the signal ø4 is brought to a high level again with the elapse of time. Thus, the switch 11 is closed so that the input voltage Vi is input to the comparator 110 from the analog input line 41. Before the switch 11 is closed, an electric charge, which is applied based on an output signal output from the D-A converter 20 through an output line 44 and which is proportional to the output voltage of the D-A converter 20, is stored at a point c. When the switch 11 is closed, the voltage and charge at the point c are varied according to the voltage corresponding to the difference between the analog input voltage Vi and the voltage output from the D-A converter 20. Following this variation, a voltage and an electric charge at a point d are changed, thus resulting in a variation in voltage input to the inverting amplifier 14. When the signal ø5 is at a low level, the switch 112 is controlled so as to output a signal produced from the inverting amplifier 14 through the inverting amplifier 111. Namely, when the signal ø5 is at a low level, the output of the inverting amplifier 14 is inverted by the inverting amplifier 111, from which the inverted output is produced. Thus, the reason why the output of the inverting amplifier 14 is inverted by means of the inverting amplifier 111, is that the comparison for the MSB corresponding to the first bit and the comparison between the analog input Vi and the output signal of the D-A converter 20 by the comparator 110 are in reverse relationship. Namely, upon comparison with the first bit, a comparison decision is made as to whether the output signal of the D-A converter 20 is larger or smaller than the input analog signal Vi. Upon comparison with the second bit, to the contrary, a comparison decision is made as to whether the input analog signal Vi is larger or smaller than the output signal of the D-A converter 20. In order to compensate for the reversal of this relationship, the signal outputted from the inverting amplifier 14 is further inverted by the inverting amplifier 111 in the case of the second bit. Thus, when the output voltage of the D-A converter 20 is lower than the analog input voltage Vi in the same manner as when compared with the odd bits, "1" is obtained as the signal output from the comparator 110. On the other hand, when the output voltage of the D-A converter 20 is higher than the analog input voltage Vi, "0" is obtained as the signal output from the comparator 110. The resultant signal is stored at the second bit of the successive approximation register 30 during each interval in which the signal ø6 is at a high level.

The odd bits and the even bits are hereafter alternately and repeatedly exchanged so that A-D conversion is effected on n bits (where n is a natural number). A comparison is made to the odd bits in a manner similar to the aforementioned first bit, i.e., MSB, whereas a comparison is made to the even bits in a manner similar to the aforementioned second bit.

In the present embodiment, the signal amplifying stage of the chopper-type comparator comprises the switch 15, the inverting amplifier 14 and a capacitor 13. However, when an increase in signal amplification degree is further needed, several stages of inverting amplifiers may be series-connected to each other. It is, however, necessary to provide an odd number of stages in order to equalize phases, as a result of the phase comparison in the aforementioned embodiment.

Assuming now that the reference clocks $ø_{AD}$ shown in FIGS. 2 and 10 are identical in speed to each other, the A-D converter 100 according to the present embodiment can bring about the result of A-D conversion corresponding to 5 bits while the conventional A-D converter shown in FIG. 9 can obtain the result of A-D conversion corresponding to 4 bits. Namely, speed-up of the A-D converter can be achieved without increasing the frequency of the reference clock.

[Second embodiment]

Figure 3:
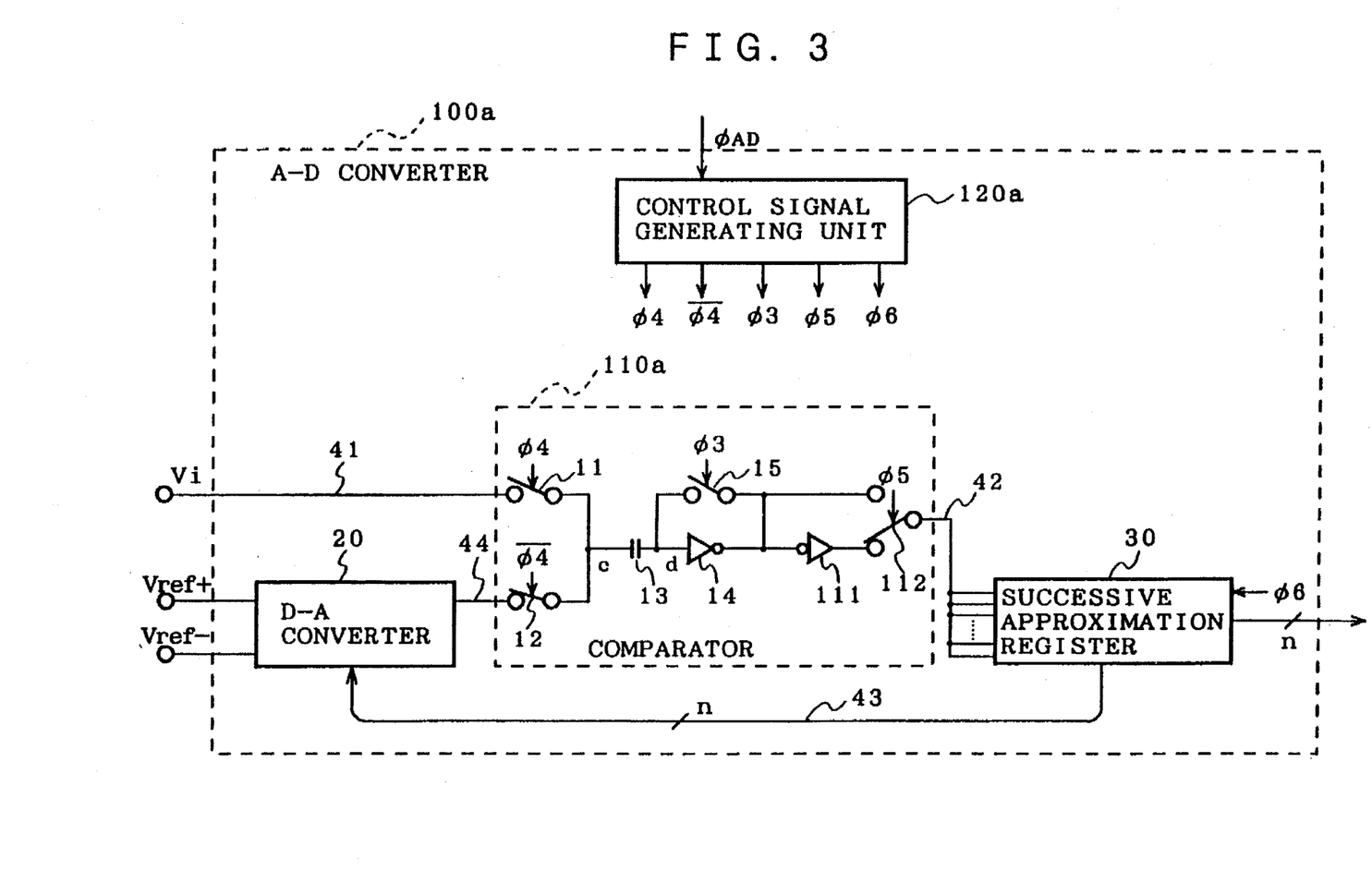
FIG. 3 is a view illustrating the structure of an A-D converter according to a second embodiment of the present invention.

FIG. 3 is a view showing the structure of an A-D converter according to a second embodiment of the present invention. In the drawing, reference numeral 110a indicates a comparator. Reference numeral 120a indicates a control signal generating unit. The same elements as those shown in FIG. 1 are identified by like reference numerals and the description of common elements will therefore be omitted.

Figure 4:
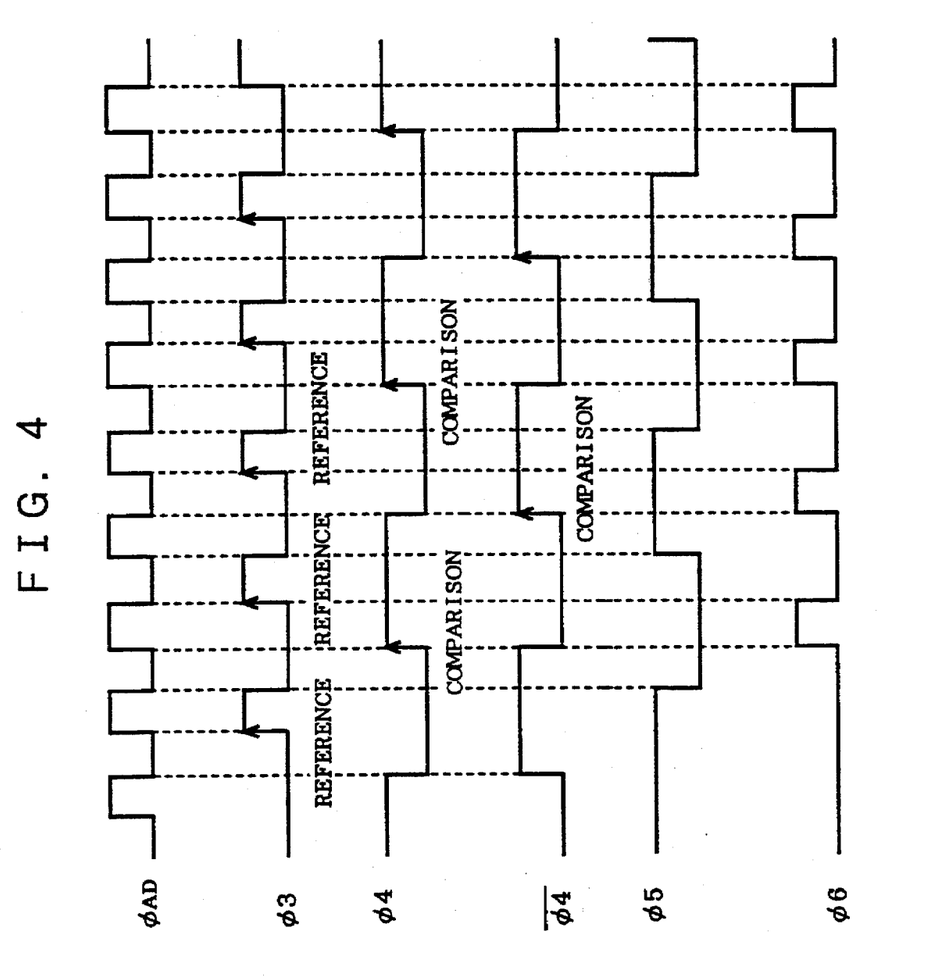
FIG. 4 is a timing chart for describing timings for respective control signals employed in the A-D converter shown in FIG. 3.

The operation of the present invention in accordance with the second embodiment will now be described. FIG. 4 is a timing chart for describing timings for respective control signals employed in the A-D converter 100a, which are generated from the control signal generating unit 120a employed in the present embodiment. The present timing chart differs from the timing chart shown in FIG. 2 in that signals ø4, ø4 and ø5 are inverted.

When the A-D converter 100a starts A-D conversion, the A-D converter 100a temporarily sets a first bit, i.e., the MSB (Most Significant Bit) of a successive approximation register 30 to "1" and other bits to "0," respectively. A digital signal output from the successive approximation register 30 is supplied to a D-A converter 20 through an output signal line 43. Therefore, the output of the D-A converter 20 is brought to half (½) of a full-scale voltage $V_{FS}$. Next, a switch 12 is closed in response to the rising edge of the signal ø4 so that an a signal output from the D-A converter 20 is brought into an ON state. A switch 15 is then closed in response to the rising edge of a signal ø3 short-circuiting the input and output of an inverting amplifier 14. Thereafter, a switch 11 is closed in response to the rising edge of the signal ø4 so that the voltage input to the inverting amplifier 14 is varied according to a voltage corresponding to the difference between an input analog voltage Vi (first analog voltage) and the voltage (second analog voltage) output from the D-A converter 20. The output of the inverting amplifier 14 is further inverted by an inverting amplifier 111. When the output voltage of the D-A converter 20 is lower than the analog input voltage, a signal of "1" is output from the comparator 110a. When the output voltage of the D-A converter 20 is higher than the analog input voltage, a signal of "0" is output therefrom (comparison operation).

Each of the output signals is stored in the successive approximation register 30 as MSB during an interval in which a signal ø6 is at a high level and the comparison between the $V_{FS}/2$ and the analog input voltage is completed. Thereafter, data stored in the successive approximation register 30 is transferred to the D-A converter 20 where it is D-A converted.

Upon comparison between the analog input voltage and a second bit, i.e., the next bit after the MSB, the A-D converter 100a then sets a second bit as seen from the MSB of the successive approximation register 30 to "1". When the result of comparison of MSB is "1" at this time, the voltage output from the D-A converter 20 becomes $(V_{FS}/2)+(V_{FS}/4)$. On the other hand, when the result of comparison of MSB is "0", the output voltage thereof becomes $(V_{FS}/2)-(V_{FS}/4)$. In the case of the comparison between the second bit and the analog input voltage, unlike the comparison of the MSB, the threshold value of the comparator 110a is set based on the analog input voltage on the rising edge of the signal ø3.

Next, the signal ø4 is brought to a high level again with a lapse of time. Therefore, the switch 12 is closed so that the output voltage from the D-A converter 20 is input. Before the switch 12 is closed, an electric charge, which is proportional to a voltage applied based on the analog input signal input through an analog input line 41, is stored at a point c. When the switch 12 is closed, the voltage and charge at the point c are varied according to the voltage corresponding to the difference between the analog input voltage Vi and the voltage output from the D-A converter 20. Following this variation, a voltage and an electric charge at a point d are changed. Namely, the voltage input to the inverting amplifier 14 is varied.

Since the signal ø5 is at a high level upon comparison with the second bit, the output of the inverting amplifier 14 is directly output without being inverted. Thus, when the output voltage of the D-A converter 20 is lower than the analog input voltage Vi in the same manner as when compared with the first bit, "1" is obtained as the signal output from the comparator 110a. On the other hand, when the output voltage of the D-A converter 20 is higher than the analog input voltage Vi, "0" is obtained as the signal output from the comparator 110a. The resultant signal is stored at the second bit of the successive approximation register 30 during each interval in which the signal ø6 is at a high level.

Odd bits and even bits are hereafter alternately and repeatedly exchanged so that A-D conversion is effected on n bits. A comparison is made to the odd bits in a manner similar to the aforementioned first bit, i.e., MSB, whereas a comparison is made to the even bits in a manner similar to the aforementioned second bit.

In the present embodiment, the signal amplifying stage of the chopper-type comparator comprises the switch 15, the inverting amplifier 14 and a capacitor 13. However, when an increase in signal amplification degree is further needed, several stages of inverting amplifiers may be series-connected to each other. It is, however, necessary to provide an odd number of inverting amplifier stages in order to equalize phases as a result of the phase comparison in the described embodiment.

Assuming now that the reference clocks $ø_{AD}$ shown in FIGS. 4 and 10 are identical in speed to each other, the A-D converter 100a according to the present embodiment can bring about the result of A-D conversion corresponding to 5 bits while the conventional A-D converter shown in FIG. 9 can obtain the result of A-D conversion corresponding to 4 bits. Namely, speed-up of the A-D converter can be achieved without increasing the frequency of the reference clock.

[Third embodiment]

Figure 5:
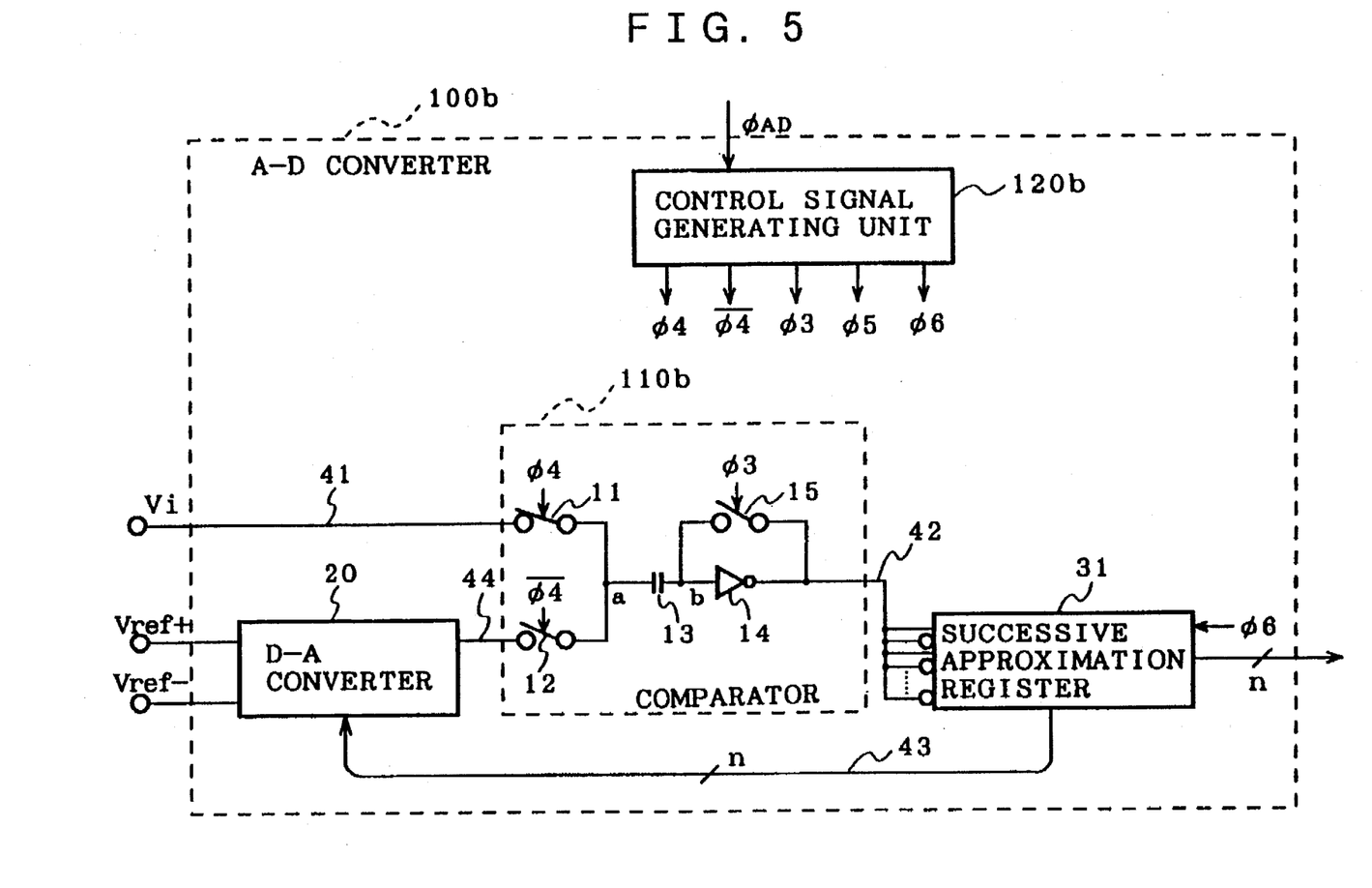
FIG. 5 is a view showing the structure of an A-D converter according to a third embodiment of the present invention.

FIG. 5 illustrates the structure of an A-D converter according to a third embodiment of the present invention. The same elements as those shown in FIG. 1 are identified by the same reference numerals and the description of common elements will therefore be omitted. In FIG. 5, reference numeral 31 indicates a successive approximation register for inverting input signals for even bits in the register. Reference numeral 110b indicates a comparator and reference numeral 120b indicates a control signal generating unit.

Figure 6:
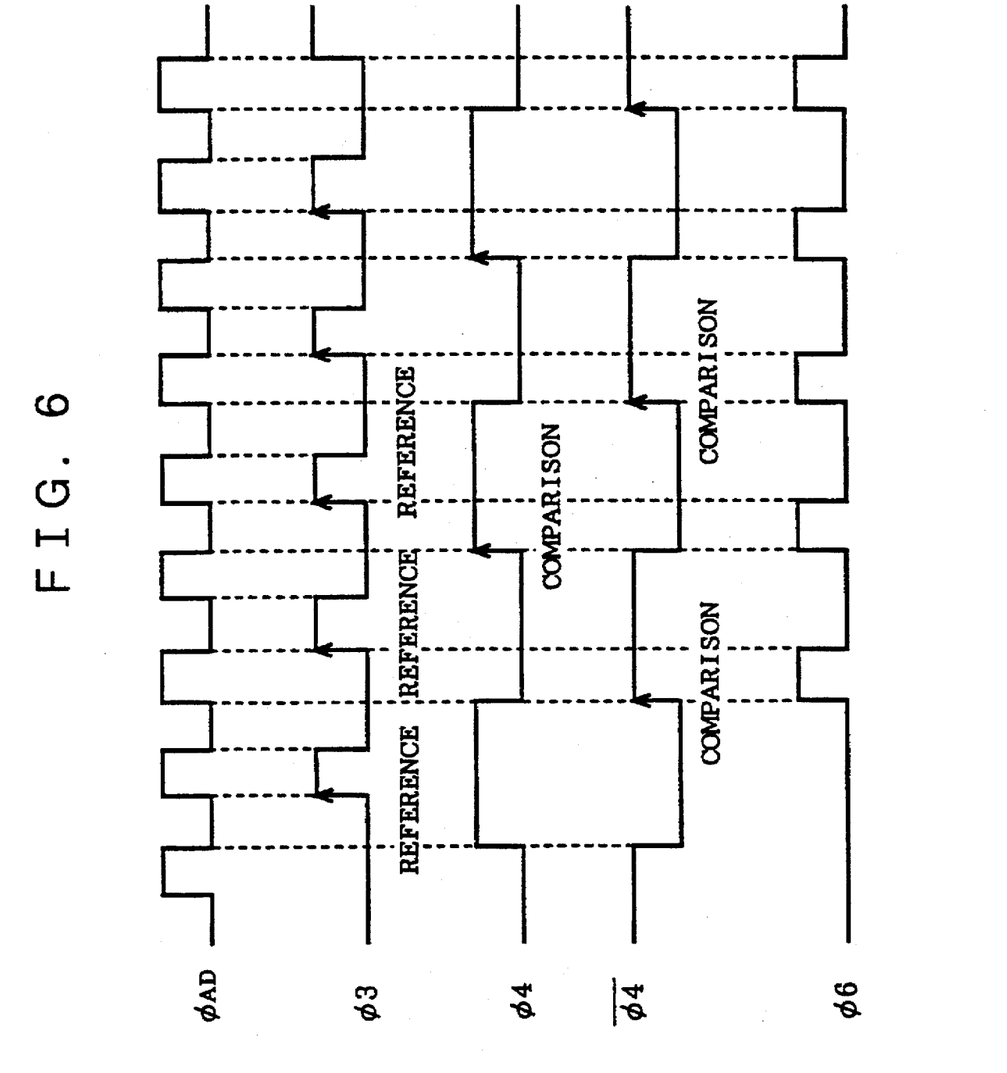
FIG. 6 is a timing chart for describing timings for respective control signals employed in the A-D converter shown in FIG. 5.

The operation of the present invention in accordance with the third embodiment will now be described. FIG. 6 is a timing chart for describing timings for control signals output from the control signal generating unit 120b. Upon conversion of MSB corresponding to a first bit, a switch 11 is closed in response to the rising edge of a signal ø4 so that an analog input voltage Vi (first analog voltage) is input to the comparator 110b. Next, a switch 15 in the comparator 110b is closed in response to the rising edge of a signal ø3 so as to short-circuit the input and output of an inverting amplifier 14. At this time, the balance between an electric charge of a capacitor 13 on the point a side and an electric charge thereof on the point b side is achieved. Further, the voltage at the point b is set so as to become equal to a threshold value of the inverting amplifier 14 itself by a self-output of the inverting amplifier 14.

After the voltage at the point b has been made equal to the threshold value of the inverting amplifier 14, the switch 15 is opened in response to the falling edge of the signal ø3 so that the input voltage of the inverting amplifier 14 is maintained at a voltage equal to the threshold value of the inverting amplifier 14 owing to the electric charge at the point b.

Next, the switch 12 is closed in response to the rising edge of a signal ø4 and simultaneously the switch 11 is opened in response to the falling edge of the signal ø4, so that a signal output from a D-A converter 20 is input to the comparator 110b through an output line 44. An electric charge proportional to the analog input voltage Vi applied through an analog input line 41 is stored at the point a. However, when the switch 12 is closed, the voltage and charge at the point a are varied according to a voltage corresponding to the difference between the analog input voltage Vi and the voltage (second analog voltage) output from the D-A converter 20. In response to this variation, the charge and voltage at the point b are changed, thus resulting in a variation in input voltage of the inverting amplifier 14.

According to the above operation, when the output voltage of the D-A converter 20 is lower than the analog input voltage, a signal of "1" is output from the output of the comparator 110b. When the output voltage of the D-A converter 20 is higher than the analog input voltage, a signal of "0" is output from the output of the comparator 110b. Each of the output signals is stored in the successive approximation register 31 during each interval in which a signal ø6 is at a high level.

In the case of the next bit after the MSB, i.e., a second bit, the switch 15 is closed (reference operation) in response to the rising edge of the ø3 in a state in which the switch 12 is in a closed state, i.e., in a state in which the output signal of the D-A converter 20 is input to the comparator 110b, so that the input and output of the inverting amplifier 14 are short-circuited. At this time, the balance between the electric charge of a capacitor 13 on the point a side and the electric charge on the point b side is achieved. Further, the voltage at the point b is set to equal a threshold value of the inverting amplifier 14 itself by the output of the inverting amplifier 14.

After the voltage at the point b has been made equal to the threshold value of the inverting amplifier 14, the switch 15 is opened in response to the falling edge of the signal ø3 so that the input voltage of the inverting amplifier 14 is maintained at a voltage equal to the threshold value of the inverting amplifier 14 owing to the electric charge at the point b. Next, the switch 11 is closed in response to the rising edge of the signal ø4 and the switch 12 is opened in response to the falling edge of the signal ø4, so that the voltage and charge at the point a are varied according to the voltage corresponding to the difference between the analog input voltage Vi and the output voltage of the D-A converter 20. In response to this variation, the charge and voltage at the point b are changed, thus resulting in a variation in input voltage of the inverting amplifier 14.

According to the above operation, when the output voltage of the D-A converter 20 is lower than the analog input voltage Vi, a signal of "0" is output from the output of the comparator 110b. When the output voltage of the D-A converter 20 is higher than the analog input voltage, a signal of "1" is output from the output of the comparator 110b.

Since the successive approximation register is constructed so as to invert the output signal of the inverting amplifier 14 in the case of the even bits, the comparison output signal corresponding to the second bit is inverted. Each output signal is stored in the successive approximation register 31 during each interval in which the signal ø6 is at a high level. Namely, when the output voltage of the D-A converter 20 is lower than the analog input voltage Vi, a signal of "1" is stored in the successive approximation register 31, whereas when the output voltage of the D-A converter 20 is higher than the analog input voltage, a signal of "0" is stored in the successive approximation register 31 (comparison operation).

The A-D converter of the present embodiment can bring about the same results as those obtained in the first and second embodiments without repeated alternating the inversion and non-inversion of the signal by the inverting amplifier 111 on the even-bit and odd-bit basis as in the case of the first and second embodiments.

[Fourth embodiment]

Figure 7:
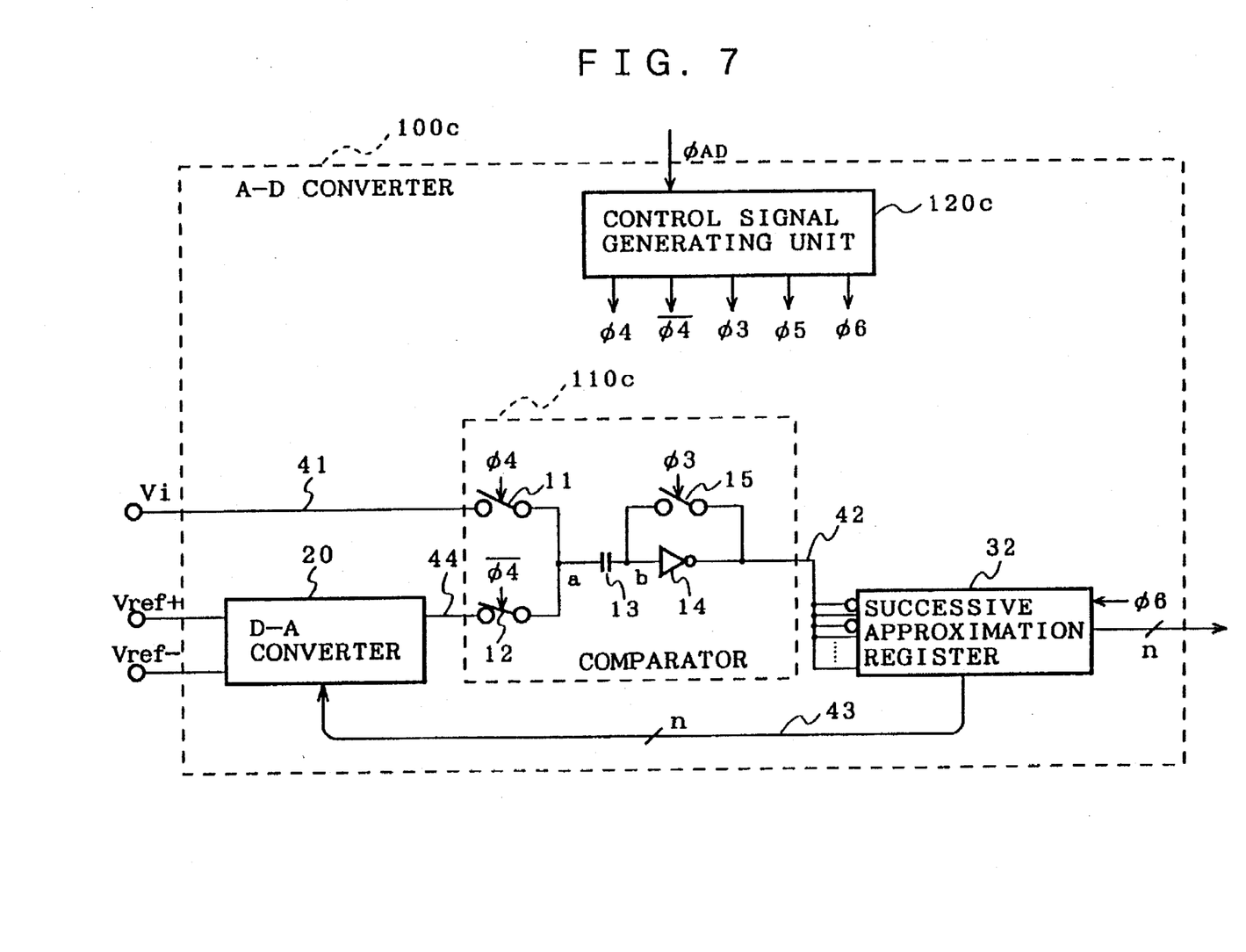
FIG. 7 is a view showing the structure of an A-D converter according to a fourth embodiment of the present invention.

FIG. 7 illustrates the structure of an A-D converter according to a fourth embodiment of the present invention. The same elements as those shown in FIG. 1 are identified by like reference numerals and the description of common elements will therefore be omitted. In FIG. 7, reference numeral 32 indicates a successive approximation register for inverting input signals for odd bits in the register. Reference numeral 110c indicates a comparator. Reference numeral 120c indicates a control signal generating unit.

Figure 8:
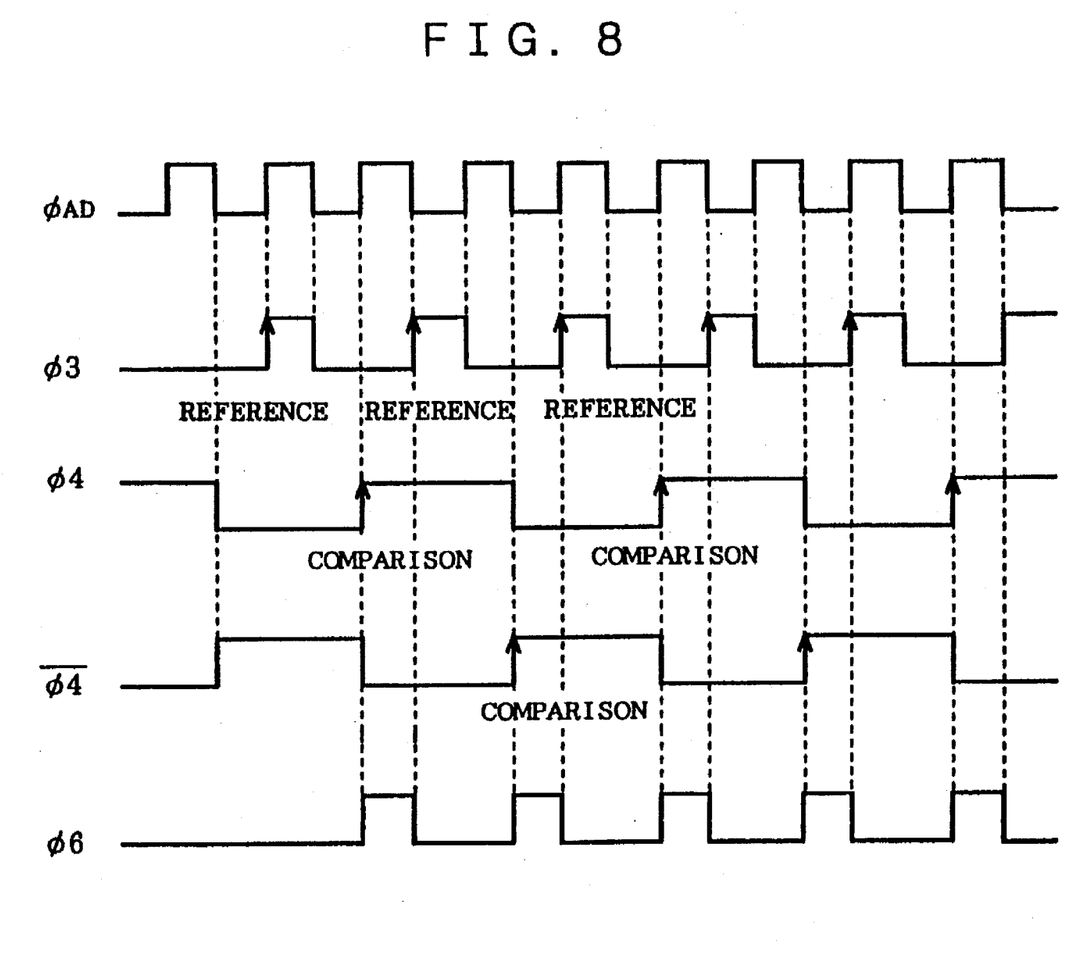
FIG. 8 is a timing chart for describing timings for respective control signals employed in the A-D converter shown in FIG. 7.

The operation of the present invention in accordance with the fourth embodiment will now be described. FIG. 8 is a timing chart for describing timings for control signals output from the control signal generating unit 120c. Upon conversion of the MSB corresponding to a first bit, a switch 12 is closed in response to the rising edge of a signal ø4 so that a voltage output from a D-A converter 20 is input to the comparator 110c. Next, a switch 15 in the comparator 110c is closed in response to a signal ø3 so as to short-circuit the input and output of an inverting amplifier 14. At this time, the balance between an electric charge of a capacitor 13 on the point a side and an electric charge on the point b side is achieved. Further, the voltage at the point b is set so as to become equal to a threshold value of the inverting amplifier 14 itself by the output of the inverting amplifier 14.

After the voltage at the point b has been made equal to the threshold value of the inverting amplifier 14, the switch 15 is opened in response to the falling edge of the signal ø3 so that the input voltage of the inverting amplifier 14 is maintained at a voltage equal to the threshold value of the inverting amplifier 14 due to the electric charge at the point b.

Next, the switch 11 is closed in response to the rising edge of a signal ø4 and simultaneously the switch 12 is opened in response to the falling edge of the signal ø4, so that an analog input voltage Vi (first analog voltage) is input to the comparator 110c through an input line 41. An electric charge proportional to the output voltage of the D-A converter 20 is stored at the point a. However, when the switch 11 is closed, the voltage and charge at the point a are varied according to a voltage corresponding to the difference between the analog input voltage Vi and the voltage (second analog voltage) output from the D-A converter 20. In response to this variation, the charge and voltage at the point b are changed, thus resulting in a variation in input voltage of the inverting amplifier 14.

According to the above operation, when the output voltage of the D-A converter 20 is lower than the analog input voltage, a signal of "0" is output from the output of the comparator 110c. When the output voltage of the D-A converter 20 is higher than the analog input voltage, a signal of "1" is output from the output of the comparator 110c.

Since the successive approximation register 32 is constructed so as to invert the output signal of the inverting amplifier 14 in the case of the odd bits, the comparison output signal corresponding to the first bit is inverted. Each output signal is stored in the successive approximation register 32 during each interval in which a signal ø6 is at a high level. Namely, when the output voltage of the D-A converter 20 is lower than the analog input voltage Vi, a signal of "1" is stored at the MSB of the successive approximation register 32, whereas when the output voltage of the D-A converter 20 is higher than the analog input voltage, a signal of "0" is stored in the successive approximation register 32 (comparison operation).

In the case of the next bit after the MSB, i.e., a second bit, the switch 15 is closed (reference operation) in response to the rising edge of the ø3 in a state in which the switch 11 is in a closed state, i.e., in a state in which the analog input voltage Vi is input to the comparator 110c, so that the input and output of the inverting amplifier 14 are short-circuited. At this time, the balance between the electric charge of the capacitor 13 on the point a side and the electric charge on the point b side is achieved. Further, the voltage at the point b is set so as to become equal to a threshold value of the inverting amplifier 14 itself by the output of the inverting amplifier 14.

After the voltage at the point b has been made equal to the threshold value of the inverting amplifier 14, the switch 15 is opened in response to the falling edge of the signal ø3 so that the input voltage of the inverting amplifier 14 is maintained at a voltage equal to the threshold value of the inverting amplifier 14 due to the electric charge at the point b. Next, the switch 11 is opened in response to the falling edge of the signal ø4 and the switch 12 is closed in response to the rising edge of the signal ø4, so that the voltage and charge at the point a are varied according to the voltage corresponding to the difference between the analog input voltage Vi and the output voltage of the D-A converter 20. In response to this variation, the charge and voltage at the point b are changed, thus resulting in a variation in the input voltage of the inverting amplifier 14.

According to the above operation, when the output voltage of the D-A converter 20 is lower than the analog input voltage Vi, a signal of "1" is output from the output of the comparator 110c. When the output voltage of the D-A converter 20 is higher than the analog input voltage, a signal of "0" is output from the output of the comparator 110c.

The output signals are successively stored over a range from the MSB to the LSB of the successive approximation register 30 during each interval in which the signal ø6 is at a high level.

Namely, the A-D converter of the present embodiment can bring about the same results as those obtained in the first and second embodiments without repeated alternating the inversion and non-inversion of the signal by the inverting amplifier 111 on the even-bit and odd-bit basis as in the case of the first and second embodiments.

The operations of the first through fourth embodiments described above have been described based on the timing charts shown in FIGS. 2, 4, 6 and 8. However, each of the control signals may not be necessarily synchronized with the clock $\phi_{AD}$. For example, the signal ø6 may be set to a one-shot pulse generated each time the polarity of the signal ø4 varies, by using an analog delay circuit.

Having now fully described the invention, it will be apparent to those skilled in the art that many changes and modifications can be made without departing from the spirit or scope of the invention as set forth herein.

What is claimed is:

1. An analog-to-digital converter for converting an input analog voltage into an n-bit digital signal, where n is a natural number, the analog-to-digital converter comprising:

a digital-to-analog converter for converting an n-bit digital signal into an analog reference voltage;

comparing means for comparison of the analog reference voltage and an input analog voltage at each of n bits of the n-bit digital signal, the analog reference voltage and the input analog voltage being used in alternation, for every other bit of the n-bits, as a reference in the comparison, and for outputting for each comparison a one-bit result-of-comparison signal indicative of a result of the comparison;

signal inverting means for inverting only alternating result-of-comparison signals and for outputting inverted and non-inverted result-of-comparison signals; and a successive approximation register having storage areas respectively corresponding to the n bits, for successively storing the inverted and non-inverted result-of-comparison signals for each of the n bits as the n-bit digital signal, for outputting the n-bit digital signal as a digital signal, and for transferring the n-bit digital signal to said digital-to-analog converter.

2. The analog-to-digital converter according to claim 1, wherein said comparing means includes a chopper comparator and wherein the input analog voltage is the reference for the comparison of odd bits of the n bits.

3. The analog-to-digital converter according to claim 1, wherein said comparing means includes a chopper comparator and wherein the input analog voltage is the reference for the comparison of even bits of the n bits.

4. The analog-to-digital converter according to claim 2, wherein said signal inverting means includes an inverting amplifier and a switch for selecting whether a result-of-comparison signal is inverted by said inverting amplifier.

5. The analog-to-digital converter according to claim 3, wherein said signal inverting means includes an inverting amplifier and a switch for selecting whether a result-of-comparison signal is inverted by said inverting amplifier.

6. The analog-to-digital converter according to claim 2, wherein said signal inverting means includes inverting amplifiers respectively provided at inputs of said successive approximation register to even-bit storage areas.

7. The analog-to-digital converter according to claim 3, wherein said signal inverting means includes inverting amplifiers respectively provided at inputs of said successive approximation register to even-bit storage areas.

8. The analog-to-digital converter according to claim 2, wherein said signal inverting means includes inverting amplifiers respectively provided at inputs of said successive approximation register to odd-bit storage areas.

9. The analog-to-digital converter according to claim 3, wherein said signal inverting means includes inverting amplifiers respectively provided at inputs of said successive approximation register to odd-bit storage areas.

* * * * *